United States Patent [19]

Lavie et al.

[11] Patent Number: 5,691,247
[45] Date of Patent: Nov. 25, 1997

[54] METHOD FOR DEPOSITING A FLOW FILL LAYER ON AN INTEGRATED CIRCUIT WAFER

[75] Inventors: Zmira Lavie, Zichron Yaakov; Aviad Roth, Yishuv Adi; Jeff Levy, Moshav Netofah; Itzhak Edrei, Haifa, all of Israel

[73] Assignee: Tower Semiconductor Ltd., Migdal Haemek, Israel

[21] Appl. No.: 769,853

[22] Filed: Dec. 19, 1996

[51] Int. Cl.$^6$ .................................................. A01L 21/316
[52] U.S. Cl. ........................... 437/225; 437/235; 437/238
[58] Field of Search ...................................... 437/235, 238, 437/195, 225

[56] References Cited

U.S. PATENT DOCUMENTS

| | | | |
|---|---|---|---|
| 5,003,062 | 3/1991 | Yen | 437/231 |
| 5,079,188 | 1/1992 | Kawai | 437/195 |
| 5,094,984 | 3/1992 | Liu et al. | 437/235 |
| 5,354,387 | 10/1994 | Lee et al. | 148/33.3 |
| 5,364,818 | 11/1994 | Ouellet | 437/195 |
| 5,503,882 | 4/1996 | Dawson | 437/238 |

OTHER PUBLICATIONS

Kiermasz, A. Et al, "Planarisation for Sub–Micron Devices Utilising a New Chemistry", *DUMIC Conference*, pp. 94–100, Feb. 1995.

Matsuura, M. Et al, "Novel Self–planarizing CVD Oxide for Interlayer Dielectric Applications", *IEEE IEDM*, 1994, pp. 117–120.

Dobson, C.D. et al, "Advanced $SiO_2$ Planarization Using Silane and $H_2O_2$", *Semiconductor Int'l.*, pp. 85–88, Dec. 1994.

Roberts, B. et al, "Interconnect Metallization for Future Device Generations", *Solid State Tech.*, pp. 69–70, Feb. 1995.

McClatchie, S. Et al, "Inorganic CVD Planarization", *European Semiconductor*, pp. 21–22, Sep. 1995.

Electotech Corp., brochure regarding Advanced Planarization Process.

*Primary Examiner*—Charles L. Bowers, Jr.
*Assistant Examiner*—Matthew Whipple
*Attorney, Agent, or Firm*—Mark M. Friedman

[57] ABSTRACT

An improved method for depositing the cap layer of a flow fill layer of an integrated circuit. The cap layer is deposited in at least two steps, instead of all at once.

5 Claims, 1 Drawing Sheet

FIGURE - PRIOR ART
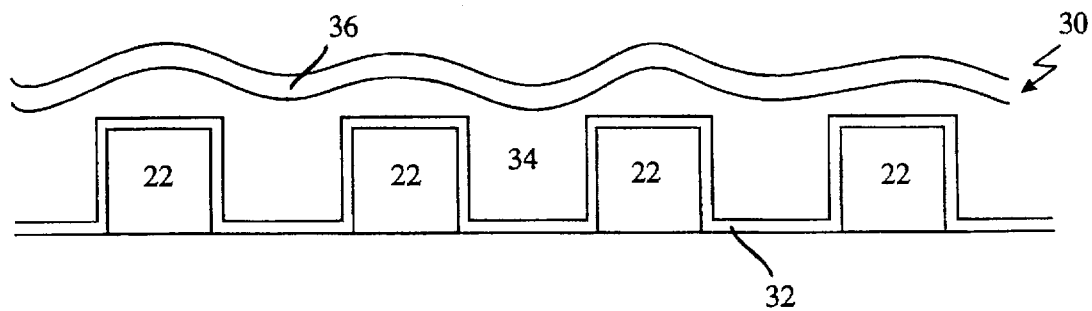

METHOD FOR DEPOSITING A FLOW FILL LAYER ON AN INTEGRATED CIRCUIT WAFER

FIELD AND BACKGROUND OF THE INVENTION

The present invention relates to the fabrication of ultra large scale integrated circuits and, more particularly, to an improved method for depositing a flow fill intermetallic dielectric on a wafer bearing these circuits.

The latest ultra large scale integrated circuits include features as small as about 0.5 microns and smaller. To effect contact with these features, the metallic contacts in the chip that contains the circuits must be stacked in three or more levels. These contacts are formed by a process that includes lithography and etch, and are separated by an intermetallic dielectric, typically $SiO_2$. For successful lithography and etch in the formation of a second or subsequent level of metal, the substrate above which they are deposited must be substantially flat.

A process for depositing an $SiO_2$ intermetallic dielectric with a substantially flat upper surface is described in C. D. Dobson, A. Kiermasz, K. Beekman and R. J. Wilby, *Advanced $SiO_2$ planarization using silane and $H_2O_2$*, Semiconductor International, December 1994, pp. 85–88; in M. Matsuura, Y. Hayashide, H. Kotani, T. Nishimura, H. Iuchi, C. D. Dobson, A. Kiermasz, K. Beekmann and R. Wilby,; and in A. Kiermasz, C. D. Dobson, K. Beekmann and A. H. Bar-Ilan, *Planarization for sub-micron devices utilizing a new chemistry*, DUMIC Conference, Feb. 21–22, 1995, pp. 94–100. These references are incorporated by reference for all purposes as if fully set forth herein. The FIGURE schematically shows the "flow fill layer" 30 thus deposited between and around metallic contacts 22. Flow fill layer 30 includes a base layer 32, a flowlayer 34, and a cap layer 36. The essence of the process is the deposition of flowlayer 34, by reacting $SiH_4$ and $H_2O_2$ at 0° C. to form a liquid layer, believed to be primarily $Si(OH)_4$ in composition. The liquid flows around and above metallic contacts 22, providing a dielectric layer with a substantially flat top surface. Base layer 32 of $SiO_2$ is deposited, prior to the deposition of flowlayer 34, by plasma enhanced chemical vapor deposition (PECVD), to provide a surface to which flowlayer 34 adheres well. Cap layer 36 of $SiO_2$ is deposited over flowlayer 34, also by PECVD, to protect flowlayer 34 in the final step: baking the wafer at a temperature of between 400° C. and 450° C. to transform flowlayer 34 from $Si(OH)_4$ to $SiO_2$.

It is important that flowlayer 34 not have cracks. The transformation of $Si(OH)_4$ to $SiO_2$ involves the evaporation of water as steam, which may induce the formation of cracks in flowlayer 34 as flowlayer 34 is transformed from a liquid to a solid. One of the purposes of cap layer 36 is to prevent the formation of these cracks. Cap layers 36 deposited by the processes known in the art have not been entirely successful in preventing crack formation.

There is thus a widely recognized need for, and it would be highly advantageous to have, a method of depositing a cap layer of a flow fill layer that protects the flowlayer of the flow fill layer against crack formation to a greater extent than the processes known in the art.

SUMMARY OF THE INVENTION

According to the present invention there is provided, in a process for depositing a flow fill layer on an integrated circuit wafer, the flow fill layer including a cap layer for preventing crack formation during the evaporation of water, an improved method for depositing the cap layer to a final thickness, comprising the steps of: (a) depositing a first thickness of the cap layer on the wafer; (b) evaporating at least a portion of the water via the first thickness of the cap layer; and (c) subsequent to the evaporation, depositing a second thickness of the cap layer on the wafer.

In the conventional process for depositing cap layer 36, the wafer is warmed to a temperature of about 300° C. and the entire cap layer 36 is deposited in one PECVD step. The innovation of the present invention is to deposit cap layer 36 in two or more PECVD steps. In each PECVD step, a different partial thickness of cap layer 36 is deposited.

BRIEF DESCRIPTION OF THE DRAWINGS

The invention is herein described, by way of example only, with reference to the accompanying drawings, wherein:

The sole FIGURE (prior art) is a schematic cross-section through a flow fill layer.

DESCRIPTION OF THE PREFERRED EMBODIMENTS

The present invention is of a method for depositing a cap layer of a flow fill layer. Specifically, the present invention can be used to inhibit crack formation in the flowlayer of the flow fill layer.

The principles of cap layer deposition according to the present invention may be better understood with reference to the following description. The process parameters described herein are specific to the manufacture of a flow fill layer whose base layer 32 is 2000 Å thick, whose flowlayer 34 is 9000 Å thick, and whose cap layer is 3000 Å thick, using a Planar 200 multi-chamber cluster tool manufactured by Electrotech of Bristol, UK; but it will be readily apparent to one ordinarily skilled in the art how to adjust the parameters for flow fill layers of other geometries and for other integrated circuit manufacturing devices.

The process parameters recommended by Electrotech are as follows:

| Base Layer: | |
| --- | --- |
| pressure | 1400 mT |
| Nitrogen | 1500 sccm |
| Nitrous Oxide | 3500 sccm |
| $SiH_4$ | 150 sccm |
| RF power | 100 W |
| time | 38 seconds |
| Flowlayer: | |
| pressure | 850 mT |
| Nitrogen | 300 sccm |
| $SiH_4$ | 120 sccm |
| 60% $H_2O_2$ | 0.65 g/sec |
| time | 62 seconds |
| Cap Layer: Warm-up Step: | |
| final temperature | 300° C. |
| time | 90 seconds |
| Cap Layer: Deposition: | |
| pressure | 750 mT |
| Nitrogen | 1000 sccm |
| Nitrous Oxide | 2000 sccm |
| $SiH_4$ | 100 sccm |
| RF power | 500 W |
| time | 36 seconds |

In the Electrotech warm-up step, the wafer is maintained at a temperature of 300° C. for about 90 seconds in order to start the evaporation water from flowlayer 34 before the actual deposition of the cap layer.

According to the present invention, cap layer 36 preferably is deposited in only two PECVD steps. In the first step, approximately the first 1000 Å of cap layer 36 is deposited. The wafer then is maintained at a temperature of between 300° C. and 350° C. for between 90 seconds and 180 seconds to start the evaporation of water from flowlayer 34 through this first portion of the cap layer. In the second step, the remaining 2000 Å of cap layer 36 is deposited.

| Cap Layer: First Step: Warm-up: | |
| --- | --- |
| final temperature | 300° C.–350° C. |
| time | up to 10 seconds |
| Cap Layer: First step: Deposition: | |
| pressure | 750 mT |
| Nitrogen | 1000 sccm |
| Nitrous Oxide | 2000 sccm |
| SiH$_4$ | 100 sccm |
| RF power | 500 W |
| time | 12 seconds |
| Cap Layer: Second Step: Warm-up: | |
| final temperature | 300° C.–350° C. |
| time | 90–180 seconds |
| Cap Layer: Second Step: Deposition: | |
| pressure | 750 mT |
| Nitrogen | 1000 sccm |
| Nitrous Oxide | 2000 sccm |
| SiH$_4$ | 100 sccm |
| RF power | 500 W |
| time | 24 seconds |

It is to be understood that these parameters are illustrative only. The essence of the present invention is the deposition of cap layer 36 in several steps, rather than all at once, with partial evaporation of water from flowlayer 34 in between the several steps. It will be apparent, to one ordinarily skilled in the art, how to adapt these parameter values for other applications.

While the invention has been described with respect to a limited number of embodiments, it will be appreciated that many variations, modifications and other applications of the invention may be made.

What is claimed is:

1. In a process for depositing a flow fill layer on an integrated circuit wafer, the flow fill layer including a cap layer for preventing crack formation during the evaporation of water, an improved method for depositing the cap layer to a final thickness, comprising the steps of:

(a) depositing a first thickness of the cap layer on the wafer;

(b) evaporating at least a portion of the water via said first thickness of the cap layer subsequent to depositing said first thickness; and (c) subsequent to said evaporation, depositing a second thickness of the cap layer on the wafer, wherein said first and second thicknesses combined equal said final thickness.

2. The method of claim 1, further comprising the step of maintaining the wafer at a temperature of between about 300° C. and about 350° C. for up to about 10 seconds prior to said depositing of said first thickness of the cap layer.

3. The method of claim 1, wherein said first thickness of the cap layer is between about 1/6 and about 1/3 of the final thickness of the cap layer.

4. The method of claim 1, wherein said first thickness of the cap layer is between about 500 Å and about 1000 Å.

5. The method of claim 1, wherein said evaporation of water is effected by maintaining the wafer at a temperature of between about 300° C. and about 350° C. for between about 90 seconds and about 180 seconds.

* * * * *